United States Patent
Nakayama et al.

(10) Patent No.: US 9,978,653 B2
(45) Date of Patent: May 22, 2018

(54) METHOD OF MANUFACTURING SEMICONDUCTOR DEVICE

(71) Applicant: HITACHI KOKUSAI ELECTRIC INC., Tokyo (JP)

(72) Inventors: Masanori Nakayama, Toyama (JP); Tadashi Terasaki, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days. days.

(21) Appl. No.: 15/389,766

(22) Filed: Dec. 23, 2016

(65) Prior Publication Data
US 2018/0090397 A1 Mar. 29, 2018

(30) Foreign Application Priority Data
Sep. 26, 2016 (JP) .................. 2016-186957

(51) Int. Cl.
*H01L 21/66* (2006.01)
(52) U.S. Cl.
CPC ................... *H01L 22/26* (2013.01)
(58) Field of Classification Search
CPC combination set(s) only.
See application file for complete search history.

(56) References Cited

U.S. PATENT DOCUMENTS

| | | | |
|---|---|---|---|
| 7,047,099 B2 * | 5/2006 | Shanmugasundram | B24B 49/18 257/E21.525 |
| 2003/0003607 A1 | 1/2003 | Kagoshima et al. | |
| 2003/0130754 A1 | 7/2003 | Tanaka et al. | |
| 2004/0121495 A1 * | 6/2004 | Sonderman | H01L 22/20 438/14 |
| 2012/0253724 A1 | 10/2012 | Asai et al. | |

FOREIGN PATENT DOCUMENTS

| | | |
|---|---|---|
| JP | 2012-216697 A | 11/2012 |
| KR | 10-0463256 B1 | 1/2005 |
| KR | 10-0937607 B1 | 1/2010 |
| WO | 2007/037012 A1 | 4/2007 |

OTHER PUBLICATIONS

Korean Office Action dated Jan. 17, 2018 for the Korean Patent Application No. 10-2016-0174778.
Japanese Office Action dated Mar. 28, 2018 for the Japanese Patent Application No. 2016-186957.

* cited by examiner

*Primary Examiner* — Matthew Reames

(74) *Attorney, Agent, or Firm* — Volpe and Koenig, P.C.

(57) ABSTRACT

A method of manufacturing a semiconductor device includes: processing a substrate by operating a processing apparatus included in a substrate processing apparatus, based on a first process setting; acquiring apparatus data of the processing apparatus when processing the substrate; generating first evaluation data of the processing apparatus based on an evaluation factor corresponding to the first process setting and the apparatus data; determining one or more recipe items executable in the processing apparatus based on the first evaluation data; and notifying the one or more recipe items.

18 Claims, 12 Drawing Sheets

FIG. 7

| Measurement value | Step A Evaluation factor | Step B Evaluation factor | Host device input Evaluation factor |
|---|---|---|---|
| Measurement value 1 (Temperature) | A1  3 | B1  1 | Y1  3 |
| Measurement value 2 (Gas flow rate) | A2  6 | B2  2 | Y2  5 |
| Measurement value 3 (Process chamber pressure) | A3  5 | B3  2 | Y3  6 |
| Measurement value 4 (High-frequency power) | A4  2 | B4  7 | Y4  2 |
| Measurement value 5 (Traveling wave power) | A5  2 | B5  6 | Y5  2 |
| Measurement value 6 (Reflected wave power) | A6  2 | B6  6 | Y6  2 |

FIG. 8

| Measurement value | Measurement value | | Step A Evaluation data | | Step B Evaluation data | |
|---|---|---|---|---|---|---|
| Measurement value 1 (Temperature) | +●− | X1 | 4 | a1 | 12 | b1 | 4 |
| Measurement value 2 (Gas flow rate) | +●− | X2 | 6 | a2 | 36 | b2 | 12 |
| Measurement value 3 (Process chamber pressure) | +●− | X3 | 6 | a3 | 30 | b3 | 12 |
| Measurement value 4 (High-frequency power) | +●− | X4 | 3 | a4 | 0 | b4 | 21 |
| Measurement value 5 (Traveling wave power) | +●− | X5 | 2 | a5 | 4 | b5 | 12 |
| Measurement value 6 (Reflected wave power) | +●− | X6 | 1 | a6 | 2 | b6 | 6 |

FIG. 9

| PM | Chamber | Total evaluation data | | Selectable recipe (RC) | | Selectable recipe (PM) | | Selectable recipe (Processing system) | |
|---|---|---|---|---|---|---|---|---|---|
| PM1 | CH1 | CHa | 90 points | CHa1 | Recipe A<br>Recipe B<br>Recipe C | PMa | Recipe A<br>Recipe B<br>Recipe C | PMa1 | Recipe A |
| PM1 | CH2 | CHb | 80 points | CHb1 | Recipe A<br>Recipe B<br>Recipe C | PMa | Recipe A<br>Recipe B<br>Recipe C | PMa1 | Recipe A |
| PM2 | CH3 | CHc | 60 points | CHc1 | Recipe A<br>Recipe B<br>Recipe C | PMb | Recipe A<br>Recipe B | PMb1 | Recipe A |
| PM2 | CH4 | CHd | 50 points | CHd1 | Recipe A<br>Recipe B | PMb | Recipe A<br>Recipe B | PMb1 | Recipe A |
| PM3 | CH5 | CHe | 60 points | CHe1 | Recipe A<br>Recipe B | PMc | Recipe A | PMc1 | Recipe A |
| PM3 | CH6 | CHf | 50 points | CHf1 | Recipe A | PMc | Recipe A | PMc1 | Recipe A |
| PM4 | CH7 | CHg | 60 points | CHg1 | Recipe A<br>Recipe B | PMd | Process stop<br>Maintenance | PMd1 | Maintenance |
| PM4 | CH8 | CHh | 40 points | CHh1 | Maintenance | PMd | Process stop<br>Maintenance | PMd1 | Maintenance |

FIG. 10

| Measurement value | Step A1 Evaluation data | | Step A2 Evaluation data | | Step A3 Evaluation data | | Step An Evaluation data | | Host device Second evaluation data | |
|---|---|---|---|---|---|---|---|---|---|---|
| Measurement value 1 (Temperature) | a1-1 | 12 | a1-2 | 10 | a1-3 | 10 | a1-n | 11 | y1 | 9 |
| Measurement value 2 (Gas flow rate) | a2-1 | 36 | a2-2 | 20 | a2-3 | 38 | a2-n | 25 | y2 | 24 |
| Measurement value 3 (Process chamber pressure) | a3-1 | 30 | a3-2 | 16 | a3-3 | 30 | a3-n | 20 | y3 | 15 |
| Measurement value 4 (High-frequency power) | a4-1 | 6 | a4-2 | 5 | a4-3 | 6 | a4-n | 7 | y4 | 14 |
| Measurement value 5 (Traveling wave power) | a5-1 | 4 | a5-2 | 4 | a5-3 | 4 | a5-n | 5 | y5 | 14 |
| Measurement value 6 (Reflected wave power) | a6-1 | 2 | a6-2 | 3 | a6-3 | 4 | a6-n | 4 | y6 | 12 |

FIG. 12

| Measurement value | First evaluation data (Step A1) | Second evaluation data (Host device) | Difference | First evaluation factor | Second evaluation factor |
|---|---|---|---|---|---|
| Measurement value 1 (Temperature) | a1-1  12 | y1  9 | z1  -3 | A1  3 | A1-2  2 |
| Measurement value 2 (Gas flow rate) | a2-1  36 | y2  24 | z2  -12 | A2  6 | A2-2  5 |
| Measurement value 3 (Process chamber pressure) | a3-1  30 | y3  15 | z3  -15 | A3  5 | A3-2  4 |
| Measurement value 4 (High-frequency power) | a4-1  6 | y4  14 | z4  8 | A4  2 | A4-2  3 |
| Measurement value 5 (Traveling wave power) | a5-1  4 | y5  14 | z5  10 | A5  2 | A5-2  3 |
| Measurement value 6 (Reflected wave power) | a6-1  2 | y6  12 | z6  10 | A6  2 | A6-2  3 |

METHOD OF MANUFACTURING SEMICONDUCTOR DEVICE

CROSS-REFERENCE TO RELATED APPLICATION

This application is based upon and claims the benefit of priority from Japanese Patent Application No. 2016-186957, filed on Sep. 26, 2016, the entire contents of which are incorporated herein by reference.

TECHNICAL FIELD

The present disclosure relates to a method of manufacturing a semiconductor device.

BACKGROUND

Along with the high integration of a semiconductor device represented by a large scale integrated circuit (hereinafter referred to as an LSI), a dynamic random access memory (DRAM), a flash memory or the like, miniaturization of a circuit pattern or a structure formed in a manufacturing process is underway. In a substrate processing apparatus which performs one of many processes for manufacturing a semiconductor device, FDC (Fault Detection & Classification) is performed using accumulated monitoring data. The soundness of the apparatus is checked and the abnormality of the apparatus is notified by an alarm, thereby preventing poor production.

Even if individual monitoring values of apparatuses fall within a reference value, there may be a problem in that the processing result of each substrate becomes non-uniform due to an individual difference of apparatuses.

SUMMARY

The present disclosure provides some embodiments of a technique capable of improving the processing uniformity of each substrate.

According to one embodiment of the present disclosure, there is provided a technique, including: processing a substrate by operating a processing apparatus included in a substrate processing apparatus, based on a first process setting; acquiring apparatus data of the processing apparatus when processing the substrate; generating first evaluation data of the processing apparatus based on an evaluation factor corresponding to the first process setting and the apparatus data; determining one or more recipe items executable in the processing apparatus based on the first evaluation data; and notifying the one or more recipe items.

BRIEF DESCRIPTION OF THE DRAWINGS

FIG. 7 illustrates an example of a table of evaluation factors for individual processes according to one embodiment.

FIG. 8 illustrates an example of evaluation data for individual processes according to one embodiment.

FIG. 9 illustrates an example of selectable recipes based on the evaluation result according to one embodiment.

FIG. 10 illustrates an example of evaluation data in the case where a process according to one embodiment is repeated multiple times.

FIG. 12 illustrates an example of a change table of evaluation factors according to another embodiment.

DETAILED DESCRIPTION

Embodiments of the present disclosure will now be described.

First Embodiment

One embodiment of the present disclosure will now be described with reference to the drawings. Hereinafter, a substrate processing system according to the present embodiment will be described.

(1) Configuration of Substrate Processing System

Figure 1:
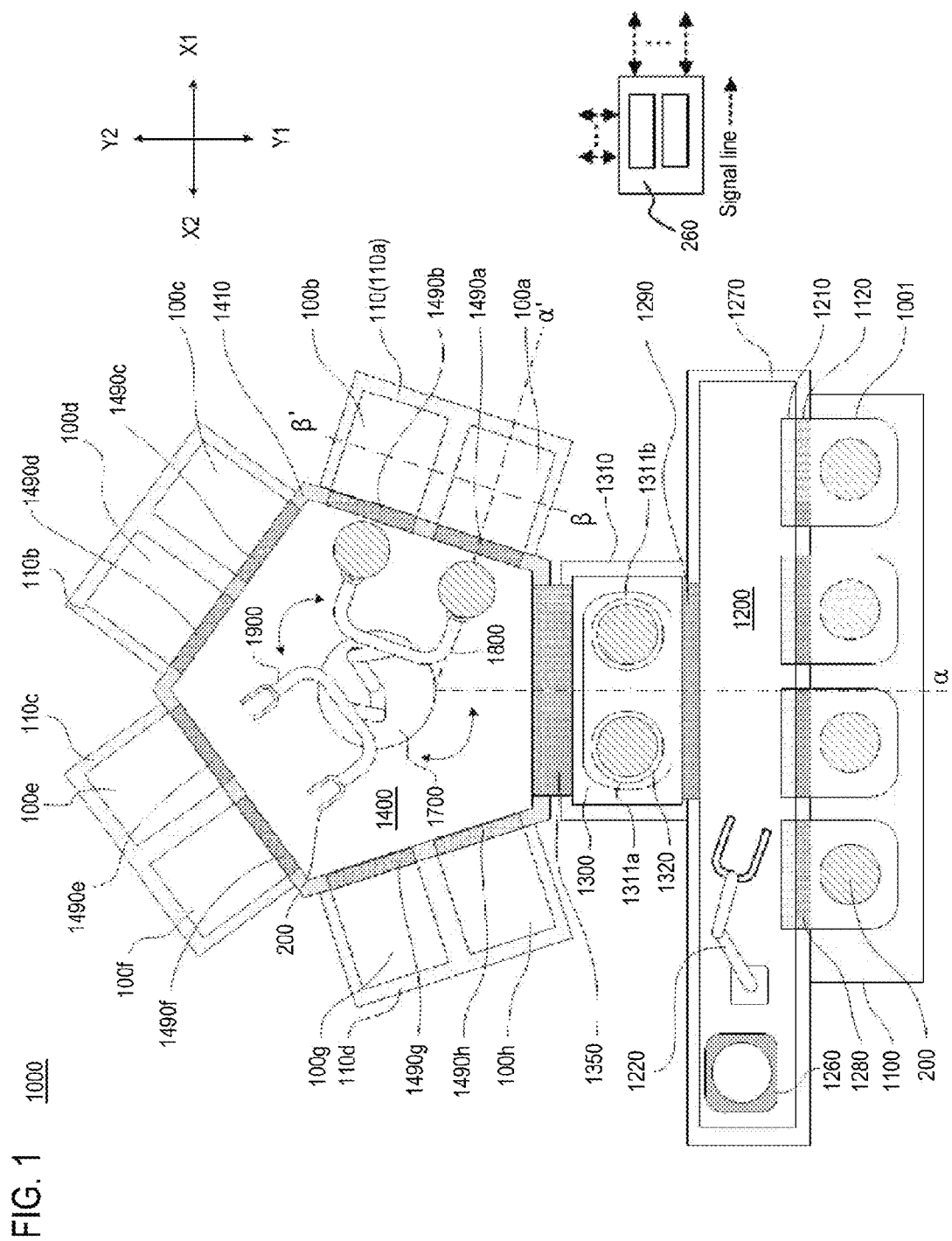
FIG. 1 is a schematic horizontal sectional view of a substrate processing system according to one embodiment.
Figure 2:
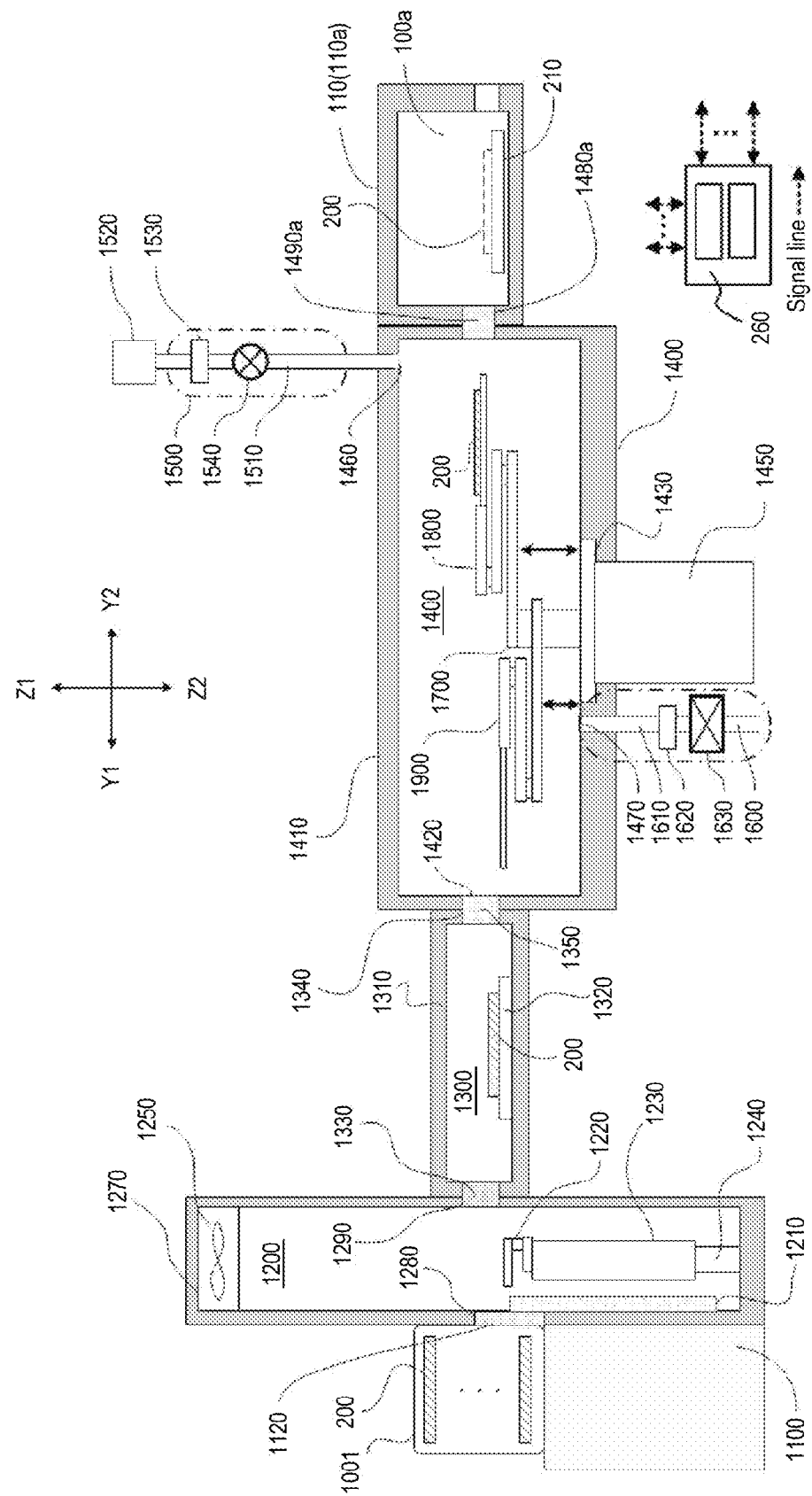
FIG. 2 is a schematic vertical sectional view of the substrate processing system according to one embodiment.
Figure 3:
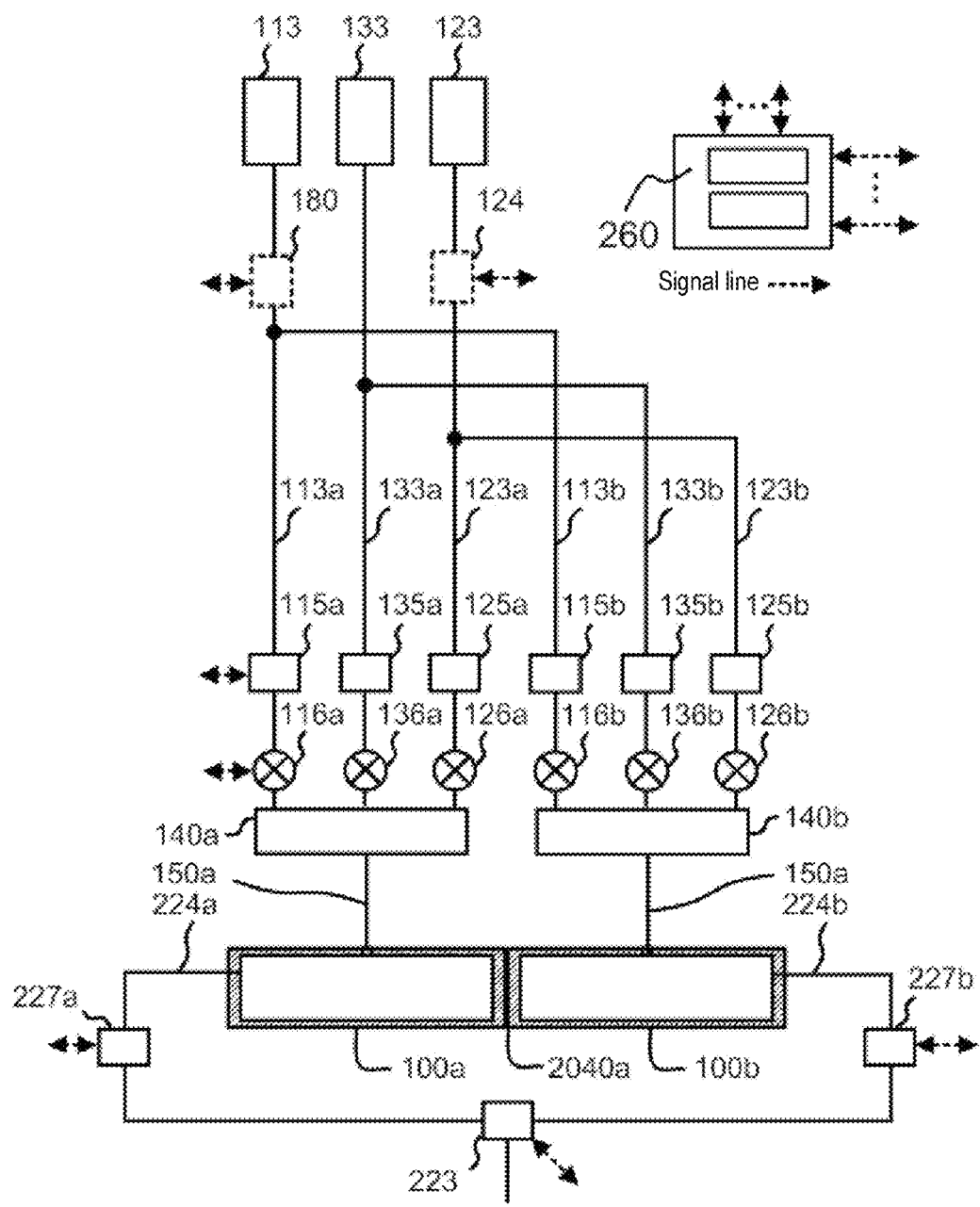
FIG. 3 is a schematic view of a gas supply system and a gas exhaust system of a process module according to one embodiment.

A schematic configuration of a substrate processing system according to one embodiment of the present disclosure will be described with reference to FIGS. 1 to 3. FIG. 1 is a horizontal sectional view of the substrate processing system according to the present embodiment. FIG. 2 is a vertical sectional view taken along line α-α' in FIG. 1, illustrating a configuration example of the substrate processing system according to the present embodiment. FIG. 3 is a vertical sectional view taken along line β-β' in FIG. 1, illustrating a gas supply system configured to supply a gas to a process module and a gas exhaust system.

Referring to FIGS. 1 and 2, a substrate processing system 1000, to which the present disclosure is applied, is configured to process wafers 200. The substrate processing system 1000 is mainly configured by an I/O stage 1100, an atmosphere transfer chamber 1200, a load lock (L/L) chamber 1300, a vacuum transfer chamber 1400 and process modules (PM) 110 as processing apparatuses. Next, the respective configurations will be described in detail. In the descriptions made with reference to FIG. 1, it is assumed that an X1 direction is the right side, an X2 direction is the left side, a Y1 direction is the front side, and a Y2 direction is the rear side.

(Atmosphere Transfer Chamber and I/O Stage)

The I/O stage (load port) 1100 is installed at the front side of the substrate processing system 1000. A plurality of pods 1001 is mounted on the I/O stage 1100. The pods 1001 are used as carriers which carry wafers 200 such as silicon (Si) substrates or the like. Unprocessed substrates (wafers) 200 or processed wafers 200 are stored in a horizontal posture within the pods 1001.

A cap 1120 is installed in each of the pods 1001 and is opened or closed by a pod opener (PO) 1210. The pod opener 1210 opens or closes the cap 1120 of each of the pods 1001 held on the I/O stage 1100 and opens or closes a substrate loading/unloading opening of each of the pods 1001, thereby enabling the wafers 200 to be loaded into or unloaded from each of the pods 1001. The pods 1001 are supplied to and discharged from the I/O stage 1100 by an in-process transfer device (RGV) not shown.

The I/O stage 1100 is adjacent to the atmosphere transfer chamber 1200. The load lock chamber 1300 to be described later is connected to a surface of the atmosphere transfer chamber 1200 other than a surface of the atmosphere transfer chamber 1200 where the I/O stage 1100 is adjacent.

An atmosphere transfer robot 1220 as a first transfer robot configured to transfer the wafers 200 is installed within the atmosphere transfer chamber 1200. As illustrated in FIG. 2, the atmosphere transfer robot 1220 is configured to be moved up and down by an elevator 1230 installed in the atmosphere transfer chamber 1200 and is also configured to be reciprocated in a left-right direction by a linear actuator 1240.

As illustrated in FIG. 2, a clean unit 1250 configured to supply clean air is installed in the upper portion of the atmosphere transfer chamber 1200. Furthermore, as illustrated in FIG. 1, a device (hereinafter referred to as a pre-aligner) 1260 configured to align a notch or an orientation flat formed in each of the wafers 200 is installed at the left side of the atmosphere transfer chamber 1200.

As illustrated in FIGS. 1 and 2, substrate loading/unloading gates 1280, through which the wafers 200 are loaded into and unloaded from the atmosphere transfer chamber 1200, and pod openers 1210 are installed on the front surface of a housing 1270 of the atmosphere transfer chamber 1200. The I/O stage 1100 is installed at the opposite side of the substrate loading/unloading gates 1280 from the pod openers 1210, namely at the outer side of the housing 1270.

A substrate loading/unloading gate 1290, through which the wafers 200 are loaded into or unloaded from the load lock chamber 1300, is installed on the rear surface of the housing 1270 of the atmosphere transfer chamber 1200. The substrate loading/unloading gate 1290 is opened and closed by a gate valve 1330 to be described later, thereby enabling the loading and unloading of the wafers 200.

(Load Lock (L/L) Chamber)

The load lock chamber 1300 is adjacent to the atmosphere transfer chamber 1200. The vacuum transfer chamber 1400 to be described later is disposed on a surface of a housing 1310 of the load lock chamber 1300 other than a surface of the housing 1310 where the atmosphere transfer chamber 1200 is adjacent. Since the internal pressure of the housing 1310 fluctuates depending on the pressure of the atmosphere transfer chamber 1200 and the pressure of the vacuum transfer chamber 1400, the load lock chamber 1300 is configured to have a structure capable of withstanding a negative pressure.

A substrate loading/unloading gate 1340 is installed on the surface of the housing 1310 that adjoins the vacuum transfer chamber 1400. The substrate loading/unloading gate 1340 is opened and closed by a gate valve (GV) 1350, thereby enabling the loading and unloading of the wafers 200.

A substrate mounting stand 1320 having at least two substrate mounting surfaces 1311 (1311a and 1311b) for holding the wafers 200 is installed within the load lock chamber 1300. The distance between the substrate mounting surfaces 1311 is set depending on a distance between fingers of a vacuum transfer robot 1700 which will be described later.

(Vacuum Transfer Chamber)

The substrate processing system 1000 includes a vacuum transfer chamber 1400 (transfer module: TM) 1400 as a transfer chamber which serves as a transfer space in which the wafers 200 are transferred under a negative pressure. A housing 1410 which constitutes the vacuum transfer chamber 1400 is formed in a pentagonal shape in a plane view.

The load lock chamber 1300 and process modules (PM) 110a to 110d configured to process the wafers 200 are connected to the respective sides of the pentagonal housing 1410. A vacuum transfer robot 1700 as a second transfer robot configured to transfer the wafers 200 under a negative pressure is installed in a substantially central portion of the vacuum transfer chamber 1400 using a flange 1430 as a base. In the present embodiment, an example is illustrated where the vacuum transfer chamber 1400 has a pentagonal shape. However, the vacuum transfer chamber 1400 may have other polygonal shapes such as a square shape or a hexagonal shape.

A substrate loading/unloading gate 1420 is installed in a sidewall of the housing 1410 which adjoins the load lock chamber 1300. The substrate loading/unloading gate 1420 is opened and closed by a gate valve 1350, thereby enabling the loading and unloading of the wafers 200.

As illustrated in FIG. 2, the vacuum transfer robot 1700 installed within the vacuum transfer chamber 1400 is configured to be moved up and down by an elevator 1450 while maintaining an air-tightness of the vacuum transfer chamber 1400 with the flange 1430. The detailed configuration of the vacuum transfer robot 1700 will be described later. The elevator 1450 is configured to independently move up and down two arms 1800 and 1900 of the vacuum transfer robot 1700. Each of the two arms 1800 and 1900 are configured to simultaneously transfer two wafers 200.

An inert gas supply hole 1460 for supplying an inert gas into the housing 1410 is formed in a ceiling of the housing 1410. An inert gas supply pipe 1510 is installed in the inert gas supply hole 1460. An inert gas source 1520, a mass flow controller (MFC) 1530 and a valve 1540 are installed in the inert gas supply pipe 1510 sequentially from the upstream side so as to control a supply amount of an inert gas supplied into the housing 1410.

An inert gas supply part 1500 of the vacuum transfer chamber 1400 is mainly configured by the inert gas supply pipe 1510, the mass flow controller 1530 and the valve 1540. Further, the inert gas source 1520 and the inert gas supply hole 1460 may be included in the inert gas supply part 1500.

An exhaust hole 1470 for exhausting an atmosphere of the housing 1410 is formed in a bottom wall of the housing 1410. An exhaust pipe 1610 is installed in the exhaust hole 1470. An auto pressure controller (APC) 1620 as a pressure controller and a pump 1630 are installed in the exhaust pipe 1610 sequentially from the upstream side.

A gas exhaust part 1600 of the vacuum transfer chamber 1400 is mainly configured by the exhaust pipe 1610 and the APC 1620. Further, the pump 1630 and the exhaust hole 1470 may be included in the gas exhaust part 1600.

The atmosphere of the vacuum transfer chamber 1400 is controlled by the cooperation of the inert gas supply part 1500 and the gas exhaust part 1600. For example, the internal pressure of the housing 1410 is controlled.

As illustrated in FIG. 1, the process modules 110a, 110b, 110c and 110d configured to perform a desired process with respect to the wafers 200 are connected to four sidewalls in which the load lock chamber 1300 is not installed, among five sidewalls of the housing 1410.

Chambers 100, which are one configuration of the substrate processing apparatus, are installed in the respective process modules 110a, 110b, 110c and 110d. Specifically, chambers 100a and 100b are installed in the process module 110a. Chambers 100c and 100d are installed in the process module 110b. Chambers 100e and 100f are installed in the process module 110c. Chambers 100g and 100h are installed in the process module 110d.

Substrate loading/unloading gates 1480 are installed in the sidewalls of the housing 1410 facing the respective chambers 100. For example, as illustrated in FIG. 2, a substrate loading/unloading gate 1480*a* is installed in the wall facing the chamber 100*a*.

As illustrated in FIG. 1, gate valves 1490 are installed in the respective process chambers. Specifically, a gate valve 1490*a* is installed between the chamber 100*a* and the vacuum transfer chamber 1400. A gate valve 1490*b* is installed between the chamber 100*b* and the vacuum transfer chamber 1400. A gate valve 1490*c* is installed between the chamber 100*c* and the vacuum transfer chamber 1400. A gate valve 1490*d* is installed between the chamber 100*d* and the vacuum transfer chamber 1400. A gate valve 1490*e* is installed between the chamber 100*e* and the vacuum transfer chamber 1400. A gate valve 1490*f* is installed between the chamber 100*f* and the vacuum transfer chamber 1400. A gate valve 1490*g* is installed between the chamber 100*g* and the vacuum transfer chamber 1400. A gate valve 1490*h* is installed between the chamber 100*h* and the vacuum transfer chamber 1400.

The substrate loading/unloading gates 1480 are opened and closed by the respective gate valves 1490, thereby enabling the loading and unloading of the wafers 200 through the substrate loading/unloading gates 1480.

(Process Module: PM)

Subsequently, the process module 110*a* among the respective process modules 110 will be described with reference to FIGS. 1, 2 and 3. FIG. 3 is an explanatory view illustrating the relationship between the process module 110*a*, the gas supply part connected to the process module 110*a* and the gas exhaust part connected to the process module 110*a*.

In the present embodiment, there is described the process module 110*a* by way of example. The remaining process modules 110*b*, 110*c* and 110*d* are identical in structure with the process module 110*a* and, therefore, will not be described herein.

As illustrated in FIG. 3, the chambers 100*a* and 100*b*, which are one configuration of the substrate processing apparatus for processing the wafer 200, are installed in the process module 110*a*. A partition wall 2040*a* is installed between the chambers 100*a* and 100*b* so that the internal atmospheres of the respective chambers are not mixed with each other.

As illustrated in FIG. 2, a substrate loading/unloading gate 1480*a* is installed in the wall where the chamber 100*a* and the vacuum transfer chamber 1400 adjoin each other. Similarly, a substrate loading/unloading gate 1480*a* is installed in the wall where the chamber 100*a* and the vacuum transfer chamber 1400 adjoin each other.

A substrate support part 210 configured to support the wafer 200 is installed in each of the chambers 100.

Gas supply parts configured to supply gases to the chambers 100*a* and 100*b* are connected to the process module 110*a*. The gas supply parts include a first gas supply part (process gas supply part), a second gas supply part (reaction gas supply part), a third gas supply part (purge gas supply part), and the like. Configurations of the respective gas supply parts will be described later.

Further, the gas exhaust part configured to exhaust the chambers 100*a* and 100*b* is installed in the process module 110*a*. As illustrated in FIG. 3, one gas exhaust part is configured to exhaust a plurality of chambers.

In this way, the plurality of chambers installed in the process module is configured to share one gas supply part and one gas exhaust part.

When a plurality of substrates is processed in a substrate processing system including a plurality of chambers, there may be a case where the following problems are posed.

(a) A problem is posed in that the processing quality differs from substrate to substrate due to the difference (individual difference) in performance between chambers.

(b) In the case where the number of recipes executable in one of the chambers of a process module is smaller than the number of recipes executable in the other chamber, a problem is posed in that the processing quality of a wafer processed in one of the chambers differs from the processing quality of a wafer processed in the other chamber.

(c) In the case where the processing performance of one of the chambers of a process module differs from the processing performance of the other chamber, a problem is posed in that the respective chambers are influenced by each other and are unable to perform a predetermined process. For example, if the processing performance of one of the chambers is lower than the processing performance of the other chamber, the processing quality of the other chamber may be degraded.

(d) A problem is posed in that, even if the monitoring data transmitted from a member of each chamber to a controller fall within a specified value, the processing quality differs from wafer to wafer due to the individual difference.

(e) In the case where one chamber is configured to execute a plurality of process recipes, a problem is posed in that the weighting to evaluation indices (evaluation factors) of members of a chamber differs from process recipe to process recipe, consequently making it difficult to give an adjustment priority to the respective members.

Next, the configuration of each camber as a substrate processing apparatus will be described.

(2) Configuration of Substrate Processing Apparatus

Figure 4:
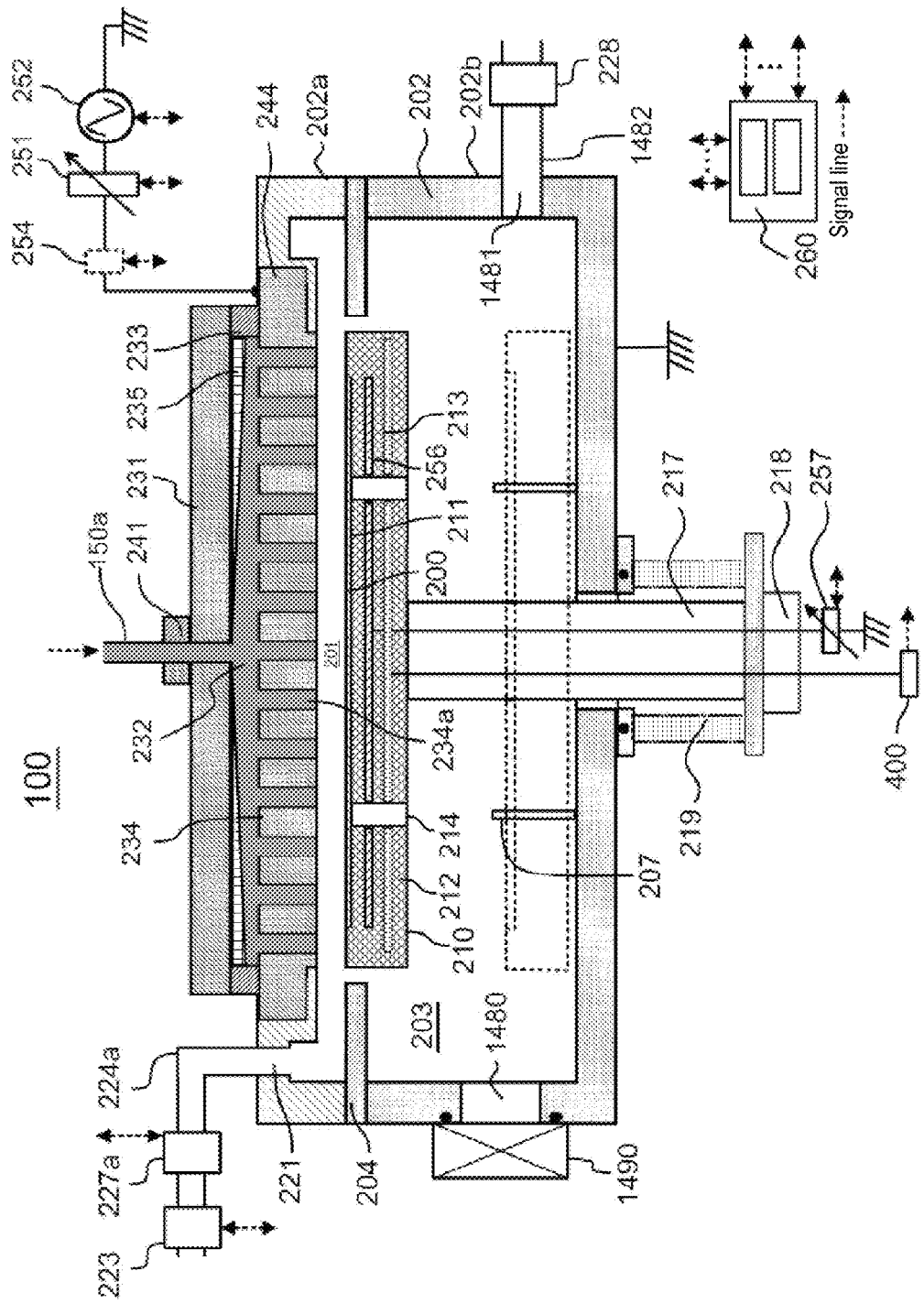
FIG. 4 is a schematic configuration view of a substrate processing apparatus according to one embodiment.

The chamber 100 is, for example, an insulation film formation unit and is configured as a single-substrate-type substrate processing apparatus as illustrated in FIG. 4. In the present embodiment, the chamber 100*a* will be described.

As illustrated in FIG. 4, the chamber 100*a* includes a process vessel 202. The process vessel 202 is configured as, e.g., a flat airtight vessel having a circular horizontal cross-section. Further, the process vessel 202 is made of a metallic material such as, e.g., aluminum (Al) or stainless steel (SUS), or quartz. A process space (process chamber) 201, in which a wafer 200 such as a silicon wafer as a substrate is processed, and a delivery space (delivery chamber) 203 are formed within the process vessel 202. The process vessel 202 is configured by an upper vessel 202*a* and a lower vessel 202*b*. A partition portion 204 is installed between the upper vessel 202*a* and the lower vessel 202*b*. A space surrounded by the upper vessel 202*a* and positioned above the partition portion 204 will be referred to as a process chamber 201. A space surrounded by the lower vessel 202*b* and positioned in the vicinity of the gate valve 1490 will be referred to as a delivery chamber 203.

A substrate loading/unloading gate 1480 adjoining a gate valve 1490 is formed on a side surface of the lower vessel 202*b*. The wafer 200 moves between the transfer chamber (not shown) and the delivery chamber 203 through the substrate loading/unloading gate 1480. A plurality of lift pins 207 is installed in a bottom portion of the lower vessel 202*b*. In addition, the lower vessel 202*b* is grounded.

A substrate support part 210 configured to support the wafer 200 is installed within the process chamber 201. The substrate support part 210 mainly includes a mounting surface 211 configured to hold the wafer 200, a substrate mounting table 212 having the mounting surface 211 on its front surface, and a heater 213 as a heating part. In the substrate mounting table 212, through-holes 214, through which lift pins 207 pass, are respectively formed in the positions corresponding to the lift pins 207. Further, a bias electrode 256 configured to apply a bias voltage to the wafer 200 or the process chamber 201 may be installed in the substrate mounting table 212. In this regard, a temperature measurement part 400 is connected to the heater 213. The temperature measurement part 400 is configured so that it can transmit the temperature information of the heater 213 to the controller 260. The bias electrode 256 is connected to a bias adjustment part 257 so that a bias can be adjusted by the bias adjustment part 257. The setting information of the bias adjustment part 257 can be transmitted to and received from the controller 260.

The substrate mounting table 212 is supported by a shaft 217. The shaft 217 extends through the bottom portion of the process vessel 202. Further, the shaft 217 is connected to an elevator part 218 outside the process vessel 202. By moving the shaft 217 up and down, and the substrate mounting table 212 through the operation of the elevator part 218, it is possible to move the wafer 200 held on the mounting surface 211 up and down. The periphery of a lower end portion of the shaft 217 is covered with a bellows 219. The interior of the process chamber 201 is kept air-tight.

When transferring the wafer 200, the substrate mounting table 212 is moved to a wafer delivery position. When subjecting the wafer 200 to a first process, the substrate mounting table 212 is moved to a first processing position (wafer processing position) as indicated by a solid line in FIG. 4. When subjecting the wafer 200 to a second process, the substrate mounting table 212 is moved to a second processing position indicated by a broken line in FIG. 4. The wafer delivery position is a position where the upper ends of the lift pins 207 protrude from the upper surface of the mounting surface 211.

Specifically, when the substrate mounting table 212 is moved down to the wafer delivery position, the upper end portions of the lift pins 207 protrude from an upper surface of the mounting surface 211 so that the lift pins 207 support the wafer 200 from below. Further, when the substrate mounting table 212 is moved up to the wafer processing position, the lift pins 207 are retracted from the upper surface of the mounting surface 211 so that the mounting surface 211 supports the wafer 200 from below. Moreover, the lift pins 207 may be made of a material such as, e.g., quartz, alumina or the like, because the lift pins 207 make direct contact with the wafer 200.

(Exhaust System)

A first exhaust port 221 as a first exhaust part configured to exhaust an atmosphere of the process chamber 201 is formed on a side surface of an inner wall of the process chamber 201 (the upper vessel 202a). An exhaust pipe 224a is connected to the first exhaust port 221. A pressure regulator 227a, such as an APC or the like, for controlling the internal pressure of the process chamber 201 at a predetermined pressure, and a vacuum pump 223 are sequentially and serially connected to the exhaust pipe 224a. A first exhaust system (exhaust line) is mainly configured by the first exhaust port 221, the exhaust pipe 224a and the pressure regulator 227a. The vacuum pump 223 may be included in the first exhaust system. Further, a second exhaust port 1481 configured to exhaust an atmosphere of the delivery chamber 203 is formed on a side surface of an inner wall of the delivery chamber 203. Moreover, an exhaust pipe 1482 is installed in the second exhaust port 1481. A pressure regulator 228 is installed in the exhaust pipe 1482 and is configured to regulate the internal pressure of the delivery chamber 203 to a predetermined pressure. The pressure regulator 228 may exhaust an internal atmosphere of the process chamber 201 through the delivery chamber 203. Further, the pressure regulator 228 is configured to transmit and receive the pressure information or the valve opening degree information to and from the controller 260. In addition, the vacuum pump 223 is configured to transmit the pump on/off information or the load information to the controller 260.

(Gas Introduction Port)

A gas introduction port 241 for supplying various kinds of gases into the process chamber 201 is formed on an upper surface (ceiling wall) of a shower head 234 installed in the upper portion of the process chamber 201. The configurations of the respective gas supply units connected to the gas introduction port 241 as a gas supply part will be described later.

(Gas Distribution Unit)

The shower head 234 as a gas distribution unit includes a buffer chamber 232 and a first electrode 244 as a first activation part. A plurality of holes 234a configured to distribute and supply a gas to the wafer 200 is formed in the first electrode 244. The shower head 234 is installed between the gas introduction port 241 and the process chamber 201. The gas introduced from the gas introduction port 241 is supplied to the buffer chamber 232 (also called a distribution part) of the shower head 234 and is supplied to the process chamber 201 through hoes 234a.

The first electrode 244 is made of electrically conductive metal and is configured as a portion of an activation part (excitation part) for exciting a gas. Electromagnetic waves (high-frequency power or microwaves) may be supplied to the first electrode 244. In the case where a lid 231 is made of an electrically conductive material, an insulation block 233 is installed between the lid 231 and the first electrode 244 to provide insulation between the lid 231 and the first electrode 244.

A gas guide 235 may be installed in the buffer chamber 232. The gas guide 235 is formed in a conical shape so that the diameter thereof grows larger as the gas guide 235 extends from the gas introduction port 241 in a radial direction of the wafer 200. The horizontal diameter of the lower end of the gas guide 235 is set to extend more outward than the end portion of the region where the holes 234a are formed. By installing the gas guide 235, it is possible to uniformly supply a gas to the respective holes 234a and to make the amount of active species supplied to the plane of the wafer 200 uniform.

(Activation Part (Plasma Generation Part))

A matcher 251 and a high-frequency power supply part 252 are connected to the first electrode 244 as an activation part and are configured to supply electromagnetic waves (high-frequency power or microwaves) to the first electrode 244. This makes it possible to activate the gas supplied into the process chamber 201. The first electrode 244 is configured to generate capacitively coupled plasma. Specifically, the first electrode 244 is formed in a plate shape by an electrically conductive material and is supported on the upper vessel 202a. The activation part is configured by at least the first electrode 244, the matcher 251 and the high-frequency power supply part 252. An impedance meter 254 may be included in the activation part. The impedance meter 254 may be installed between the first electrode 244 and the high-frequency power supply part 252. By installing the impedance meter 254, it is possible to feedback control the matcher 251 and the high-frequency power supply part 252 based on the measured impedance. The high-frequency power supply part 252 is configured to transmit and receive the power setting information to and from the controller 260. The matcher 251 is configured to transmit and receive the matching information (traveling wave data and reflected wave data) to and from the controller 260. The impedance meter 254 is configured to transmit and receive the impedance information to and from the controller 260.

(Gas Supply System)

Gas supply pipes 150a (150x) are connected to the gas introduction port 241. A first gas, a second gas and a purge gas, which will be described later, are supplied from the gas supply pipes 150x. The suffix "x" used herein refers to one of a, b, c, d, e, f, g and h corresponding to the respective chambers. Hereinafter, descriptions will be made on the gas supply system connected to the gas introduction port 241 of the chamber 100a. Descriptions on other chambers will be omitted.

FIG. 3 is a schematic configuration view of a gas supply system, including a first gas supply part, a second gas supply part, a purge gas supply part and the like, which is connected to the chamber 100a.

As illustrated in FIG. 3, a gas supply pipe collection part 140a is connected to the gas supply pipe 150a. A first gas (process gas) supply part 113a, a purge gas supply pipe 133a and a second gas (process gas) supply pipe 123a are connected to the gas supply pipe collection part 140a.

(First Gas Supply Part)

A first gas supply pipe 113a, an MFC 115a and a valve 116a are installed in the first gas supply part. A first gas supply source 113 connected to the first gas supply pipe 113a may be included in the first gas supply part. In the case where a precursor of a process gas is a liquid or a solid, a vaporizer 180 may be installed.

(Second Gas Supply Part)

A second gas supply pipe 123a, an MFC 125a and a valve 126a are installed in the second gas supply part. A second gas supply source 123 connected to the second gas supply pipe 123a may be included in the second gas supply part. A remote plasma unit (RPU) 124 may be installed so as to activate the second gas.

(Purge Gas Supply Part)

A purge gas supply pipe 133a, an MFC 135a and a valve 136a are installed in the purge gas supply part. A purge gas supply source 133 connected to the purge gas supply pipe 133a may be included in the purge gas supply part.

In this regard, the MFC, the valve, (the vaporizer) and (the RPU), which constitute each of the first gas supply part, the second gas supply part and the purge gas supply part, are configured to transmit and receive the following information to and from the controller 260. MFC: flow rate setting information, valve: opening degree information, (vaporizer: vaporization amount) and (RPU: electric power).

(Control Part)

As illustrated in FIGS. 1 to 4, the substrate processing system 1000 or the chamber 100 includes a controller 260 configured to control the operations of the respective parts of the substrate processing system 1000 and the substrate processing apparatus 100.

Figure 5:
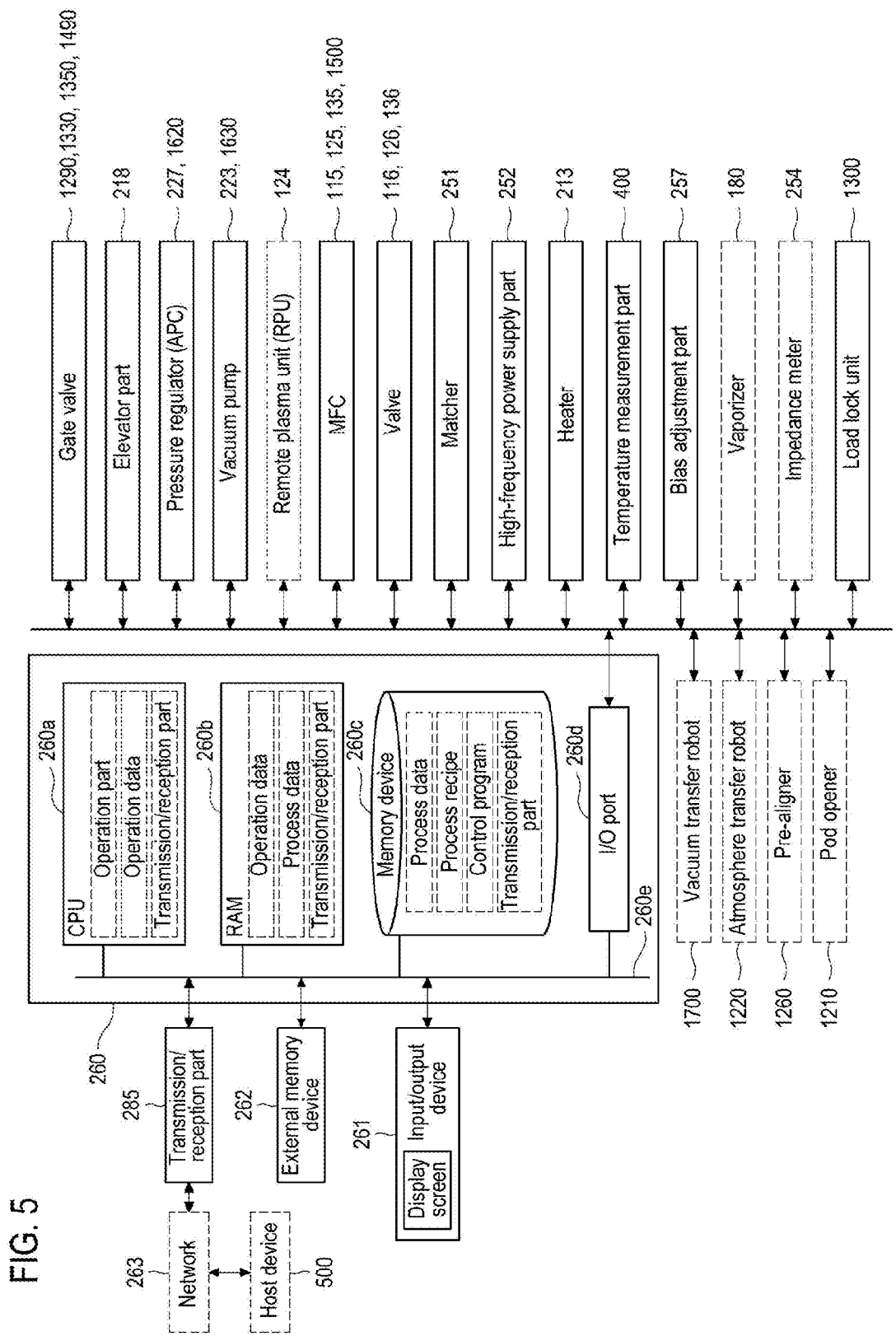
FIG. 5 is a schematic configuration view of a controller according to one embodiment.
Figure 6:
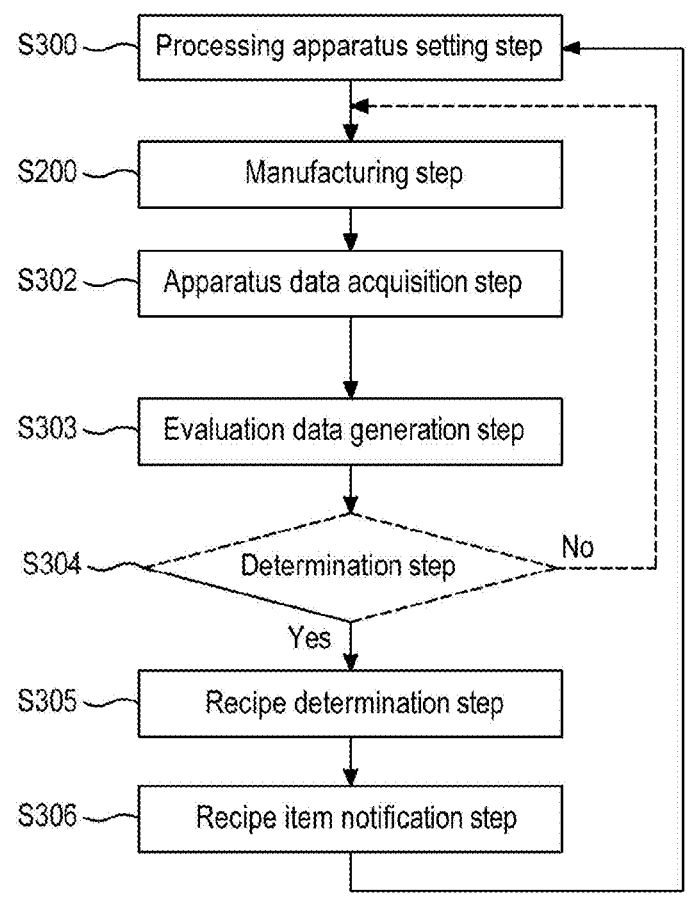
FIG. 6 is a flowchart of a recipe determination process according to one embodiment.

The outline of the controller 260 is illustrated in FIG. 5. The controller 260 serving as a control part (control means) is configured as a computer including a central processing unit (CPU) 260a, a random access memory (RAM) 260b, a memory device 260c and an I/O port 260d. The RAM 260b, the memory device 260c and the I/O port 260d are configured to exchange data with the CPU 260a via an internal bus 260e. An input/output device 261 configured as, e.g., a touch panel or the like, an external memory device 262, a transmission/reception part 285 and the like are connectable to the controller 260. The input/output device 261 includes a display screen 264 as a notification part configured to notify the state of the substrate processing apparatus 100.

The memory device 260c is configured by, for example, a flash memory, a hard disk drive (HDD), or the like. A control program for controlling the operations of the substrate processing apparatus, a process recipe in which a sequence, a condition, or the like for the substrate processing described later is written, operation data or process data generated in the course of setting a process recipe used in processing the wafer 200, and the like are readably stored in the memory device 260c. In addition, the process recipe is a combination of sequences which causes the controller 260 to execute each sequence in a substrate processing process described later in order to obtain a predetermined result. The process recipe functions as a program. Hereinafter, the process recipe, the control program, and the like will be generally and simply referred to as a program. Furthermore, the term "program" used herein may be intended to include the process recipe alone, the control program alone, or a combination of the process recipe and the control program. Moreover, the RAM 260b is configured as a memory area (work area) in which a program read by the CPU 260a and data such as operation data, process data or the like are temporarily held.

The I/O port 260d is connected to the gate valves 1290, 1330, 1350 and 1490, the elevator part 218, the heater 213, the pressure regulators 227, 228 and 1620, the vacuum pumps 223 (223a, 223b, 223c and 223d) and 1630, the matcher 251, the high-frequency power supply part 252, the MFCs 115 (115a, 115b, 115c and 115d), 125 (125a, 125b, 125c and 125d), 135 (135a, 135b, 135c and 135d) and 1530, the valves 116 (116a, 116b, 116c and 116d), 126 (126a, 126b, 126c and 126d), 136 (136a, 136b, 136c and 136d) and 1540, (the RPU 124), (the vaporizer 180), the bias adjustment part 257, the vacuum transfer robot 1700, the atmospheric transfer robot 1220, and the like. Further, the I/O port 260d may be connected to the impedance meter 254.

The CPU 260a as an operation part is configured to read the control program from the memory device 260c and to execute the control program and is configured to read the process recipe from the memory device 260c according to an operation command inputted from the input/output device 261. Further, the CPU 260a is configured to calculate operation data by comparing and operating a set value inputted from the transmission/reception part 285 and a process recipe or control data stored in the memory device 260c. Moreover, the CPU 260a is configured to execute a determination process and the like of process data (process recipe) corresponding to the operation data. In addition, the CPU 260a is configured to, according to the contents of the process recipe thus read, control the opening/closing operation of the gate valve 1490, the elevating operation of the elevator part 218, the operation of supplying electric power to the heater 213, the pressure regulating operations of the pressure regulators 227, 228 and 1620, the on/off control of the vacuum pump 223, the gas flow rate control operations of the MFCs 115, 125, 135 and 1530, the gas activating operation of the RPU 124, 144 and 154, the gas on/off control operations of the valves 116, 126, 136 and 1540, the power matching operation of the matcher 251, the power control operation of the high-frequency power supply part 252, the control operation of the bias adjustment part 257, the matching operation of the matcher 251 based on the measurement data measured by the impedance meter 254, and so forth. When performing the control of the respective components, the transmission/reception part of the CPU 260*a* transmits and receives control information which conforms to the contents of the process recipe.

The controller 260 is not limited to being configured as a dedicated computer but may be configured as a general-purpose computer. For example, the controller 260 according to the present embodiment may be configured by preparing the external memory device 262 (e.g., a magnetic tape, a magnetic disc such as a flexible disc or a hard disc, an optical disc such as a compact disc (CD) or a digital versatile disc (DVD), a magneto-optical (MO) disc, or a semiconductor memory such as a universal serial bus (USB) memory or a memory card) which stores the program described above, and installing the program on the general-purpose computer using the external memory device 262. Further, a means for supplying the program to the computer is not limited to the case of supplying the program through the external memory device 262. For example, the program may be supplied using the transmission/reception part 285 or a communication means such as a network 263 (the Internet or a dedicated line) or the like without going through the external memory device 262. Moreover, the memory device 260*c* and the external memory device 262 are configured as a non-transitory computer-readable recording medium. Hereinafter, these will be generally and simply referred to as a recording medium. Additionally, the term "recording medium" used herein may be intended to include the memory device 260*c* alone, the external memory device 262 alone, or both the memory device 260*c* and the external memory device 262.

(2) Substrate Processing Process

Next, by taking a process of forming an insulation film on a substrate as an example of one of the processes of manufacturing a semiconductor device, the operations of the substrate processing system 1000 and the substrate processing apparatus (chamber) 100, the evaluation flow of the respective parts and the sequence will be described with reference to FIGS. 6, 7, 8 and 9. As the insulation film, for example, a silicon nitride (SiN) film as a nitride film is formed. Furthermore, one of the manufacturing processes is performed by the substrate processing system 1000 and the chamber 100. In the following descriptions, the operations of the respective parts are controlled by the controller 260.

The term "substrate" used herein may be synonymous with the term "wafer." In this case, the terms "wafer" and "substrate" may be used interchangeably in the foregoing descriptions.

Hereinafter, the substrate processing process will be described.

(Processing Apparatus Setting Step S300)

When processing a substrate, the setting of the process recipe used in each chamber 100 is first performed in the controller 260. For example, the setting is performed by reading the data stored in the memory device 260*c* into the RAM 260*b* and setting the set values in the respective parts through the I/O port 260*d*. Alternatively, the setting may be performed by transmitting the process recipe from a host device 500 connected via the network 263. After the operations of the respective parts are set, a manufacturing step S200 is performed.

At the manufacturing step, the first gas is supplied into the process chamber 201 by controlling the first gas supply part according to the process recipe. The process chamber 201 is exhausted by controlling the exhaust system. Thus, the wafer 200 is processed. In this case, a CVD process may be performed by controlling the second gas supply part so that the second gas and the first gas coexist in the process space, or a cyclic process may be performed by alternately supplying the first gas and the second gas. In the case where a process is performed using the second gas in a plasma state, plasma may be generated within the process chamber 201 by using the RPU 124 or by supplying high-frequency power to the first electrode 244.

The following method is considered as the cyclic process which is a specific example of a film processing method. For example, there may be a case where a dichlorosilane ($SiH_2Cl_2$, abbreviation: DCS) gas is used as the first gas and an ammonia ($NH_3$) gas is used as the second gas. At a first step, the DCS gas is supplied to the wafer 200. At the second step, the $NH_3$ gas is supplied to the wafer 200. A purge step, at which an $N_2$ gas is supplied and the atmosphere of the process chamber 201 is exhausted, is performed between the first step and the second step. A silicon nitride (SiN) film is formed on the wafer 200 by performing a cyclic process in which the first step, the purge step and the second step are performed multiple times.

The manufacturing step S200 is performed in the aforementioned manner. After the manufacturing step S200, an apparatus data acquisition step S302 for acquiring data of the respective parts that constitute the apparatus is performed.

(Apparatus Data Acquisition Step S302)

Data of the respective parts (apparatus data) are transmitted to the controller 260 via a signal line. The controller 260 receives the data of the respective parts using the I/O port 260*d* as a data reception part and records the data in one or both of the RAM 260*b* and the memory device 260*c*. The data thus received may be transmitted to the host device 500 via the network 263.

(Evaluation Data Generation Step S303)

After acquiring the apparatus data, first evaluation data are generated. First, evaluation factors A1 to A6 or B1 to B6 corresponding to the respective measurement values are read from a table (FIG. 7) of evaluation factors of the respective parts corresponding to the respective steps (process recipe) stored in the memory device 260*c*. In this regard, the evaluation factor table is set in a corresponding relationship with the respective steps. The setting of the evaluation factors differs from step to step. In FIG. 7, two patterns are illustrated with respect to measurement values 1 to 6. However, the present disclosure is not limited thereto. In this regard, the step A is a step at which a gas flow affects a film formation result. The measurement value 2 (gas flow rate) and the measurement value 3 (process chamber pressure) are weighted. The step B is a step at which plasma contributes to a film formation result. The measurement value 4 (high-frequency power), the measurement value 5 (traveling wave power) and the measurement value 6 (reflected wave power) are weighted. While there has been described a procedure in which the evaluation factors are read from the evaluation factor table stored in the memory device 260*c*, the present disclosure is not limited thereto. The evaluation factors may be read from the host device 500 into the RAM 260*b* or the memory device 260*c* via the network 263 and the transmission/reception part 285. The evaluation factors transmitted from the host device 500 are stored in, for example, tables Y1 to Y6.

After the evaluation factors are read, as illustrated in FIG. 8, evaluation is performed based on the measurement values of the respective parts and the evaluation factors. The measurement values are calculated based on the differences from a base point B in a plus or minus direction and are respectively stored in data tables X1 to X6. Evaluation data for the respective measurement values are calculated based on the measurement value data and the evaluation factors stored in the data tables X1 to X6. The evaluation data obtained in the step A are respectively stored in a1 to a6. The evaluation data obtained in the step B are respectively stored in b1 to b6. This evaluation is performed for each chamber 100. The total scores of the evaluation data are stored as total evaluation data in a table illustrated in FIG. 9. For example, the total evaluation data of the chamber 100a (CH1) are stored in Cha. After the total evaluation data corresponding to the respective chambers CH1 to CH8 are stored, a recipe determination step S305 is performed.

(Determination Step S304)

In some cases, a determination step S304 may be performed. At the determination step S304, the accumulation of first evaluation data is carried out. In other words, a predetermined number of evaluation data are accumulated by repeatedly performing the manufacturing step S200, the apparatus data acquisition step S302 and the evaluation data generation step S303 a predetermined number of times. By accumulating the evaluation data, it is possible to perform statistical management. Examples of the statistical management include SPC (Statistical Process Control) and PC (Process Capability).

(Recipe Determination Step S305)

After performing one or both of the evaluation data generation step S303 and the determination step S304, a recipe determination step S305 is performed. As illustrated in FIG. 9, an executable recipe is determined for each chamber depending on the total scores. For example, if the total evaluation is 80 points or more, it is determined that the recipes A, B and C are selectable. If the total evaluation is 60 points or more, it is determined that the recipes A and B are selectable. If the total evaluation is 50 points or more, it is determined that the recipe A is selectable. If the total evaluation is less than 50 points, it is determined that the maintenance is selectable. The recipe data thus determined are stored in CHa1 to CHh1 of a selectable recipe table corresponding to the respective chambers.

Further, as illustrated in FIG. 9, an executable recipe is determined for each process module. In this determination, it is determined that a common denominator of selectable recipes is executable in the chamber of the process module. If the common denominator does not exist, it is determined that the process stop or the maintenance is executable. Furthermore, if the maintenance is selectable in any one of the chambers of the process module, it may be determined that the maintenance can be selected as the selectable recipe of the process module. By making a determination in this way, it is possible to equalize the process qualities of a plurality of chambers of the process module. The recipes thus determined are stored in PMa to PMd of a selectable recipe (PM) table corresponding to the respective process modules.

Moreover, as illustrated in FIG. 9, recipes executable in the substrate processing system 1000 may be determined based on the selectable recipes of the respective chambers 100 or the selectable recipe data of the respective process modules. For example, as illustrated in FIG. 9, it is determined that the recipe A is commonly executable in the process module 1, the process module 2 and the process module 3.

(Recipe Item Notification Step S306)

After the recipe determination step, the controller 260 transmits the selectable recipe data stored in the respective tables to the input/output device 261. The input/output device 261 causes the display screen 264 as a notification part to display the recipes selectable in the respective chambers or the respective process modules as illustrated in, for example, FIG. 9, thereby notifying the recipes to a user of the substrate processing system 1000. Further, the selectable recipe data may be transmitted (notified) from the transmission/reception part 285 to the host device 500 via the network 263 or the like.

While one embodiment of the present disclosure has been specifically described above, the present disclosure is not limited to the above-described embodiment but may be diversely modified without departing from the spirit of the present disclosure.

In the foregoing descriptions, there has been described an example in which the evaluation factors are read from the evaluation factor tables recorded in the memory device 260c or inputted from the host device 500. However, the present disclosure is not limited thereto. The evaluation factors may be changed from the evaluation data.

Further, there has been described an example in which the display screen 264 as a notification part is incorporated in the input/output device 261. However, the present disclosure is not limited thereto. The notification part may be provided independently of the input/output device 261. For example, it may be possible to use a display independent from the input/output device 261.

(Evaluation Factor Changing Step S400)

FIG. 10 illustrates an example of an evaluation data table generated when a plurality of evaluation data is acquired. In FIG. 10, there is illustrated a table which records the first evaluation data generated when the step A is repeatedly performed. Further, the second evaluation data inputted from the host device 500 may be inputted.

The evaluation factors may be changed by selecting arbitrary evaluation data from the evaluation data table illustrated in FIG. 10 and comparing the evaluation data.

(Evaluation Data Selection Step S401)

Figure 11:
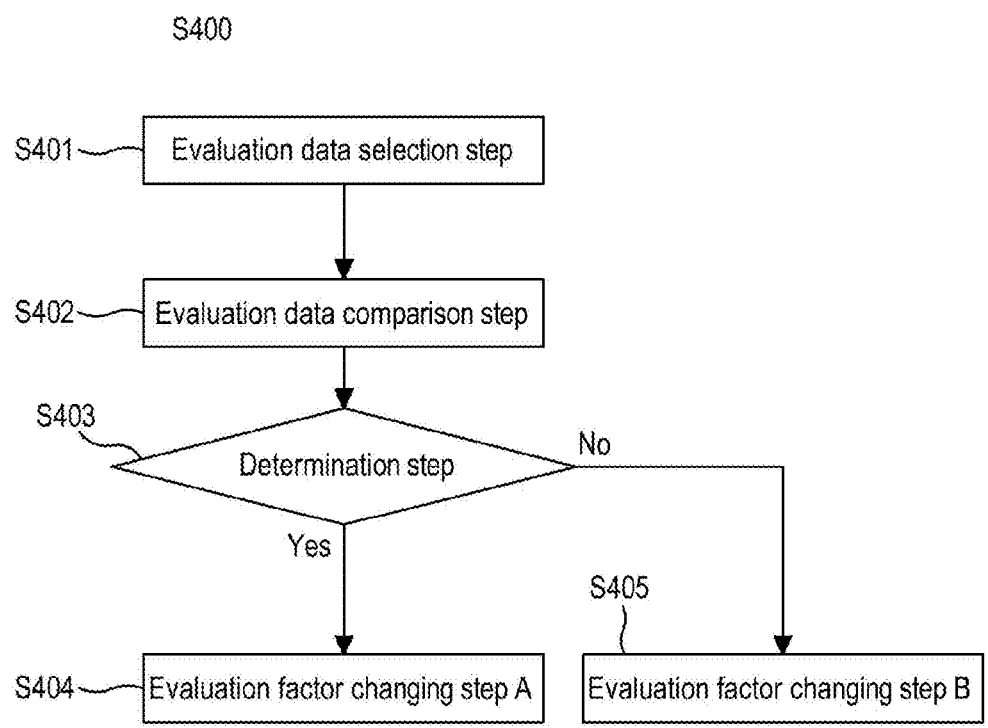
FIG. 11 is a view illustrating a change flow of evaluation factors according to another embodiment.

The evaluation factor changing step S400 will be described with reference to FIGS. 11 and 12. As illustrated in FIG. 11, an evaluation data selection step S401 is first performed.

In the present embodiment, descriptions will be made on an example in which, as illustrated in FIG. 12, the evaluation factors are changed by performing calculation based on the first evaluation data of the step A1 and the second evaluation data transmitted from the host device 500.

(Evaluation Data Comparison Step S402)

At an evaluation data comparison step S402, for example, a difference between the evaluation data of the step A1 as the first evaluation data and the second evaluation data is calculated and is recorded in the RAM 260b, the memory device 260c or the like. In this regard, the data on the difference are stored in tables z1 to z6. Thereafter, a determination step S403 is performed.

(Determination Step S403)

At a determination step S403, for example, determination is performed as to whether the difference between the first evaluation data and the second evaluation data is plus or minus. If the difference is plus, an evaluation factor changing step A (S404) is performed. If the difference is minus, an evaluation factor changing step B (S405) is performed.

(Evaluation Factor Changing Step A: S404)

At an evaluation factor changing step A, for example, calculation for increasing a first evaluation factor already set in the RAM 260b, the memory device 260c or the like is performed to calculate a second evaluation factor. The second evaluation factor is stored in tables A1-2 to A6-2.

(Evaluation Factor Changing Step B: S405)

At an evaluation factor changing step B, for example, calculation for decreasing a first evaluation factor already set in the RAM 260b, the memory device 260c or the like is performed to set a second evaluation factor.

In the present embodiment, determination is performed as to whether the difference between the first evaluation data and the second evaluation data is plus or minus. However, the present disclosure is not limited thereto. For example, a maximum value and a minimum value of the difference of the evaluation data may be determined and the evaluation factors of one or both of the maximum value and the minimum value may be changed. If the second evaluation data transmitted from the host device 500 is the best data, the evaluation factors are changed based on the minimum value. This makes it easy to bring the state of the apparatus close to an apparatus state in which the best data are obtained. Further, by changing the evaluation factors based on the maximum value, it is possible to bring the state of the apparatus away from an apparatus state in which the worst data having a largest difference from the best data are obtained.

In the foregoing descriptions, there has been described the method of forming the film by alternately supplying the first gas and the second gas. However, the present disclosure is applicable to other methods. For example, the present disclosure may be applied to a method in which the supply timings of the first gas and the second gas overlap with each other.

In the foregoing descriptions, there has been described the method of processing the substrate by supplying two kinds of gases. However, the present disclosure may be applied to a process which makes use of one kind of gas.

In the foregoing descriptions, there has been illustrated the film forming process. However, the present disclosure may be applied to other processes, for example, a diffusion process using plasma, an oxidation process, a nitriding process, an oxynitriding process, a reduction process, an oxidation/reduction process, an etching process and a heating process. For example, the present disclosure may be applied to a case where a substrate surface or a film formed on a substrate is subjected to a plasma oxidation process or a plasma nitriding process using only a reaction gas. Furthermore, the present disclosure may be applied to a plasma annealing process using only a reaction gas. These processes may be performed as the first process. Thereafter, the second process described above may be performed.

In the foregoing descriptions, there has been illustrated the semiconductor device manufacturing process. However, the present disclosure may be applied to processes other than the semiconductor device manufacturing process, for example, substrate processing processes such as a liquid crystal device manufacturing process, a solar cell manufacturing process, a light emitting device manufacturing process, a glass substrate processing process, a ceramic substrate processing process and a conductive substrate processing process.

In the foregoing descriptions, there has been illustrated the example where the silicon nitride film is formed using the silicon-containing gas as the precursor gas and using the nitrogen-containing gas as the reaction gas. However, the present disclosure may be applied to film formation using other gases. For example, the present disclosure may be applied to formation of an oxygen-containing film, a nitrogen-containing film, a carbon-containing film, a boron-containing film, a metal-containing film or a film containing these elements. Examples of these films may include an AlO film, a ZrO film, an HfO film, a HfAlO film, a ZrAlO film, a SiC film, a SiCN film, a SiBN film, a TiN film, a TiC film and a TiAlC film.

In the foregoing descriptions, there has been illustrated the apparatus configuration in which one substrate is processed in one process chamber. However, the present disclosure is not limited thereto but may be applied to an apparatus in which a plurality of substrates is horizontally or vertically arranged.

According to the present disclosure in some embodiments, it is possible to improve the processing uniformity of each substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

processing a substrate by operating a plurality of processing apparatuses included in a substrate processing system, based on a first process setting;

acquiring, by a controller, one or more measurement values of each of the plurality of processing apparatuses after processing the substrate, the one or more measurement values including at least one of a process chamber pressure, a high-frequency power, or a travelling wave power;

generating, by the controller, first evaluation data of each of the plurality of processing apparatuses corresponding to the first process setting based on one or more evaluation factors and the measurement values, the evaluation factors for the measurement values, which correspond to the first process setting, being read from at least one of a storage unit and a network;

determining one or more process recipes executable in each of the plurality of processing apparatuses based on a score value calculated from the first evaluation data of each of the plurality of processing apparatuses; and notifying one or more of the plurality of processing apparatuses of the one or more process recipes;

further processing a new substrate by operating the plurality of processing apparatuses according to the determined one or more process recipes.

2. The method of claim 1, further comprising:

displaying, on a display of each of the plurality of processing apparatuses, the one or more process recipes executable in the each of the plurality of processing apparatuses.

3. The method of claim 2, wherein the substrate processing system includes a plurality of process modules each of which includes at least two of the plurality of processing apparatuses, and further comprising:

notifying the at least two of the plurality of processing apparatuses a common process recipe, as a process recipe common to the at least two of the plurality of processing apparatuses, among the one or more process recipes.

4. The method of claim 1, wherein in the act of generating the first evaluation data, the evaluation factor is inputted from a host device to the substrate processing system.

5. The method of claim 2, wherein in the act of generating the first evaluation data, the evaluation factor is inputted from a host device to the substrate processing system.

6. The method of claim 3, wherein in the act of generating the first evaluation data, the evaluation factor is inputted from a host device to the substrate processing system.

7. The method of claim 1, wherein in the act of generating the first evaluation data, the evaluation factor is changed based on second evaluation data inputted from a host device to the substrate processing system and the first evaluation data.

8. The method of claim 2, wherein in the act of generating the first evaluation data, the evaluation factor is changed based on second evaluation data inputted from a host device to the substrate processing system and the first evaluation data.

9. The method of claim 3, wherein in the act of generating the first evaluation data, the evaluation factor is changed based on second evaluation data inputted from a host device to the substrate processing system and the first evaluation data.

10. The method of claim 4, wherein in the act of generating the first evaluation data, the evaluation factor is changed based on second evaluation data inputted from a host device to the substrate processing system and the first evaluation data.

11. The method of claim 7, further comprising:
repeating the act of processing the substrate, the act of acquiring the apparatus data and the act of generating the first evaluation data.

12. The method of claim 2, further comprising:
repeating the act of processing the substrate, the act of acquiring the apparatus data and the act of generating the first evaluation data.

13. The method of claim 3, further comprising:
repeating the act of processing the substrate, the act of acquiring the apparatus data and the act of generating the first evaluation data.

14. The method of claim 4, further comprising:
repeating the act of processing the substrate, the act of acquiring the apparatus data and the act of generating the first evaluation data.

15. The method of claim 10, further comprising:
repeating the act of processing the substrate, the act of acquiring the apparatus data and the act of generating the first evaluation data.

16. The method of claim 11, further comprising:
changing the evaluation factor based on evaluation data having a largest difference from the second evaluation data, among a plurality of first evaluation data generated in the act of repeating.

17. The method of claim 11, further comprising:
changing the evaluation factor based on evaluation data having a smallest difference from the second evaluation data, among a plurality of first evaluation data generated in the act of repeating.

18. The method of claim 1, wherein the substrate processing system includes a plurality of process modules each of which includes at least two of the plurality of processing apparatuses, and further comprising:
notifying the at least two of the plurality of processing apparatuses a common process recipe, as a process recipe common to the at least two of the plurality of processing apparatuses, among the one or more process recipes.

* * * * *